United States Patent
Sakai et al.

(10) Patent No.: US 11,973,002 B2
(45) Date of Patent: Apr. 30, 2024

(54) COMPOSITE SUBSTRATE AND METHOD FOR MANUFACTURING SAME, AND CIRCUIT SUBSTRATE AND METHOD FOR MANUFACTURING SAME

(71) Applicant: Denka Company Limited, Tokyo (JP)

(72) Inventors: Atsushi Sakai, Tokyo (JP); Masaya Yumiba, Tokyo (JP); Kentaro Nakayama, Tokyo (JP); Yoshitaka Taniguchi, Tokyo (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 17/777,549

(22) PCT Filed: Nov. 12, 2020

(86) PCT No.: PCT/JP2020/042335
§ 371 (c)(1),
(2) Date: May 17, 2022

(87) PCT Pub. No.: WO2021/100616
PCT Pub. Date: May 27, 2021

(65) Prior Publication Data
US 2022/0406678 A1    Dec. 22, 2022

(30) Foreign Application Priority Data

Nov. 21, 2019    (JP) .................... 2019-210571

(51) Int. Cl.
*H01L 23/373*    (2006.01)
*C23C 4/073*    (2016.01)
(Continued)

(52) U.S. Cl.
CPC .......... *H01L 23/3735* (2013.01); *C23C 4/073* (2016.01); *C23C 4/08* (2013.01);
(Continued)

(58) Field of Classification Search
None
See application file for complete search history.

(56) References Cited

U.S. PATENT DOCUMENTS

2014/0248505 A1*  9/2014  Kalich ................. B23K 1/0006
                                                              228/198
2015/0366048 A1* 12/2015  Nagase ................. B23K 20/02
                                                              174/255
(Continued)

FOREIGN PATENT DOCUMENTS

CN    110169213 A    8/2019
JP    H07-157857 A   6/1995
(Continued)

OTHER PUBLICATIONS

Japan Patent Office, International Search Report in International Application No. PCT/JP2020/042335 (dated Jan. 12, 2021).
(Continued)

*Primary Examiner* — Seth Dumbris
(74) *Attorney, Agent, or Firm* — Leydig, Voit & Mayer, Ltd.

(57) ABSTRACT

A composite substrate includes, in this order: a ceramic plate; a metal layer containing at least one selected from the group consisting of aluminum and an aluminum alloy; and a thermal sprayed layer containing at least one selected from the group consisting of copper and a copper alloy, and an intermetallic compound containing copper and aluminum as constituent elements is scattered between the metal layer and the thermal sprayed layer.

12 Claims, 10 Drawing Sheets

(51) Int. Cl.
  *C23C 4/08*   (2016.01)
  *C23C 4/18*   (2006.01)
  *C23C 28/00*  (2006.01)
  *H01L 21/48*  (2006.01)
  *H01L 23/00*  (2006.01)

(52) U.S. Cl.
  CPC .............. *C23C 4/18* (2013.01); *C23C 28/321* (2013.01); *H01L 21/4857* (2013.01); *H01L 24/29* (2013.01); *H01L 24/32* (2013.01); *H01L 2224/29139* (2013.01); *H01L 2224/32227* (2013.01)

(56) References Cited

U.S. PATENT DOCUMENTS

2016/0276302 A1\* 9/2016 Ohashi ................. B23K 35/262
2020/0128677 A1\* 4/2020 Sakai ..................... B32B 37/02

FOREIGN PATENT DOCUMENTS

| JP | 2007-005332 A | | 1/2007 | |
|---|---|---|---|---|
| JP | 2009-032996 A | | 2/2009 | |
| JP | 2019-067801 A | | 4/2019 | |
| JP | 2019-067803 A | | 4/2019 | |
| JP | 2019067801 A | \* | 4/2019 | |
| JP | 2019-087608 A | | 6/2019 | |
| WO | WO 2010/001998 A1 | | 1/2010 | |
| WO | WO-2018135490 A1 | \* | 7/2018 | ................ B22F 1/00 |

OTHER PUBLICATIONS

Japan Patent Office, Written Opinion in International Application No. PCT/JP2020/042335 (dated Jan. 12, 2021).

The International Bureau of WIPO, International Preliminary Report On Patentability in International Application No. PCT/JP2020/042335 (dated Jun. 2, 2022).

State Intellectual Property Office, Office Action issued in Chinese Patent Application No. 202080079297.9 (dated Jul. 19, 2023).

\* cited by examiner

COMPOSITE SUBSTRATE AND METHOD FOR MANUFACTURING SAME, AND CIRCUIT SUBSTRATE AND METHOD FOR MANUFACTURING SAME

CROSS-REFERENCE TO RELATED APPLICATIONS

This patent application is the U.S. national phase of International Application No. PCT/JP2020/042335, filed on Nov. 12, 2020, which claims the benefit of Japanese Patent Application No. 2019-210571, filed Nov. 21, 2019, the disclosures of which are incorporated herein by reference in their entireties for all purposes.

TECHNICAL FIELD

The present disclosure relates to a composite substrate and a method for manufacturing the same, and a circuit substrate and a method for manufacturing the same.

BACKGROUND ART

In recent years, power modules for high-power control have been used in industrial equipment such as motors and products such as electric vehicles. In such a power module, a circuit substrate including a ceramic plate having high thermal conductivity is used in order to efficiently diffuse heat generated from semiconductor elements.

Copper is mainly used for a metal circuit portion of the circuit substrate because a high voltage and a high current may flow. However, since the ceramic plate is repeatedly subjected to thermal shocks due to environmental changes during use, heat due to switching, and the like, the copper circuit may peel off from the ceramic plate due to thermal stress caused by a difference in thermal expansion coefficient between copper and ceramic. Therefore, a technique is known in which an aluminum layer that is easily plastically deformed is provided between the ceramic plate and the copper circuit to alleviate the thermal stress. Under such circumstances, Patent Document 1 proposes a technique in which an intermetallic compound layer and a eutectic layer are formed in a bonding layer between an aluminum member and a copper member to reduce occurrence of cracks in the bonding layer.

CITATION LIST

Patent Literature

[Patent Document 1] Japanese Unexamined Patent Publication No. 2019-87608

SUMMARY OF INVENTION

Technical Problem

Intermetallic compounds have properties of being hard and brittle. Therefore, when an intermetallic compound is formed in a layer shape, there is a concern that the intermetallic compound may cause occurrence of cracks under a heat cycle condition in which heating and cooling are repeated.

Accordingly, the present disclosure provides a composite substrate and a circuit substrate that have excellent durability against heat cycles and high electrical conductivity. In addition, the present disclosure provides a composite substrate and a method for manufacturing a circuit substrate capable of manufacturing the composite substrate and the circuit substrate having excellent durability against heat cycles and high electrical conductivity.

Solution to Problem

A composite substrate according to an aspect of the present disclosure includes, in this order: a ceramic plate; a metal layer containing at least one selected from the group consisting of aluminum and an aluminum alloy; and a thermal sprayed layer containing at least one selected from the group consisting of copper and a copper alloy, in which an intermetallic compound containing copper and aluminum as constituent elements is scattered between the metal layer and the thermal sprayed layer.

In the composite substrate, since the intermetallic compound containing copper and aluminum as constituent elements is scattered between the metal layer and the thermal sprayed layer, the metal layer and the thermal sprayed layer are strongly bonded to each other and the composite substrate has high electrical conductivity. In addition, since the intermetallic compound is not formed in a layered form but scattered, it is possible to reduce occurrence of cracks due to heat cycles and improve durability against heat cycles.

The composite substrate may include, between the metal layer and the thermal sprayed layer, a contact portion in which the metal layer and the thermal sprayed layer are in direct contact with each other, and an intervening portion in which the intermetallic compound is interposed, when viewed from a cross-section cut along the stacking direction of the metal layer and the thermal sprayed layer. Accordingly, both the bonding strength between the metal layer and the thermal sprayed layer and durability against heat cycles can be achieved at a higher level.

The intermetallic compound may contain at least one selected from the group consisting of $Cu_9Al_4$, $CuAl$, and $CuAl_2$. Accordingly, both the bonding strength between the metal layer and the thermal sprayed layer and the durability against heat cycles can be achieved at a higher level.

A length of the intermetallic compound along a boundary line on the metal layer side of the thermal sprayed layer may be 15 μm or less when viewed from a cross-section cut along a stacking direction of the metal layer and the thermal sprayed layer. When the cross-section is viewed, the coverage of the thermal sprayed layer by the intermetallic compound may be 75% or less with respect to the length of the boundary line on the metal layer side of the thermal sprayed layer. Such a composite substrate can have sufficiently high durability against heat cycles.

A circuit substrate according to an aspect of the present disclosure includes a ceramic plate and a conductor portion on the ceramic plate, in which the conductor portion includes a metal layer containing in this order from the ceramic plate side at least one selected from the group consisting of aluminum and an aluminum alloy and a thermal sprayed layer containing at least one selected from the group consisting of copper and a copper alloy, and an intermetallic compound containing copper and aluminum as constituent elements is scattered between the metal layer and the thermal sprayed layer.

In the conductor portion of the circuit substrate, since the intermetallic compound having copper and aluminum as constituent elements is scattered between the metal layer and the thermal sprayed layer, the metal layer and the thermal sprayed layer are strongly bonded to each other, and thus the conductor portion has high electrical conductivity. In addition, since the intermetallic compound is not formed in a layered form but scattered, it is possible to reduce occurrence of cracks due to heat cycles and improve durability against heat cycles.

A method of manufacturing a composite substrate according to an aspect of the present disclosure includes: forming a precursor film by spraying metallic particles containing at least one selected from the group consisting of copper and a copper alloy on a surface of a metal layer provided on a ceramic plate and containing at least one selected from the group consisting of aluminum and an aluminum alloy; and heating the precursor film to obtain a thermal sprayed layer and to generate an intermetallic compound so as to be scattered between the metal layer and the thermal sprayed layer.

In the method of manufacturing the composite substrate, the precursor film is heated to generate the intermetallic compound including copper and aluminum as constituent elements so as to be scattered between the metal layer and the thermal sprayed layer. Since the precursor film is heated until the intermetallic compound is generated so as to be scattered, a thermal sprayed layer in which work hardening is sufficiently alleviated can be obtained. The thermal sprayed layer in which the work hardening is alleviated as described above has high electrical conductivity. In addition, since the intermetallic compound is not formed in a layered form but is scattered, it is possible to reduce occurrence of cracks due to heat cycles and to improve durability against heat cycles.

A method of manufacturing a circuit substrate according to an aspect of the present disclosure includes: forming a precursor film by spraying metallic particles containing at least one selected from the group consisting of copper and a copper alloy on a surface of a metal layer provided on a ceramic plate and containing at least one selected from the group consisting of aluminum and an aluminum alloy; and heating the precursor film to obtain a thermal sprayed layer and to generate an intermetallic compound so as to be scattered between the metal layer and the thermal sprayed layer, thereby forming a conductor portion having a predetermined pattern on the ceramic plate.

In the method of manufacturing the circuit substrate, the conductor portion is formed by heating the precursor film to generate the intermetallic compound containing copper and aluminum as constituent elements in a scattered manner between the metal layer and the thermal sprayed layer. Since the precursor film is heated until the intermetallic compound is generated so as to be scattered, a thermal sprayed layer in which work hardening is sufficiently alleviated can be obtained. The thermal sprayed layer in which the work hardening is alleviated as described above has high electrical conductivity. In addition, since the intermetallic compound is not formed in a layered form but scattered, it is possible to reduce the occurrence of cracks due to heat cycles and improve durability against heat cycles.

Advantageous Effects of Invention

According to the present disclosure, it is possible to provide a composite substrate and a circuit substrate having excellent durability against heat cycles and high electrical conductivity. In addition, according to the present disclosure, it is possible to provide a method for manufacturing a composite substrate and a circuit substrate capable of manufacturing the composite substrate and the circuit substrate having excellent durability against heat cycles and high electrical conductivity.

DESCRIPTION OF EMBODIMENTS

Figure 1:
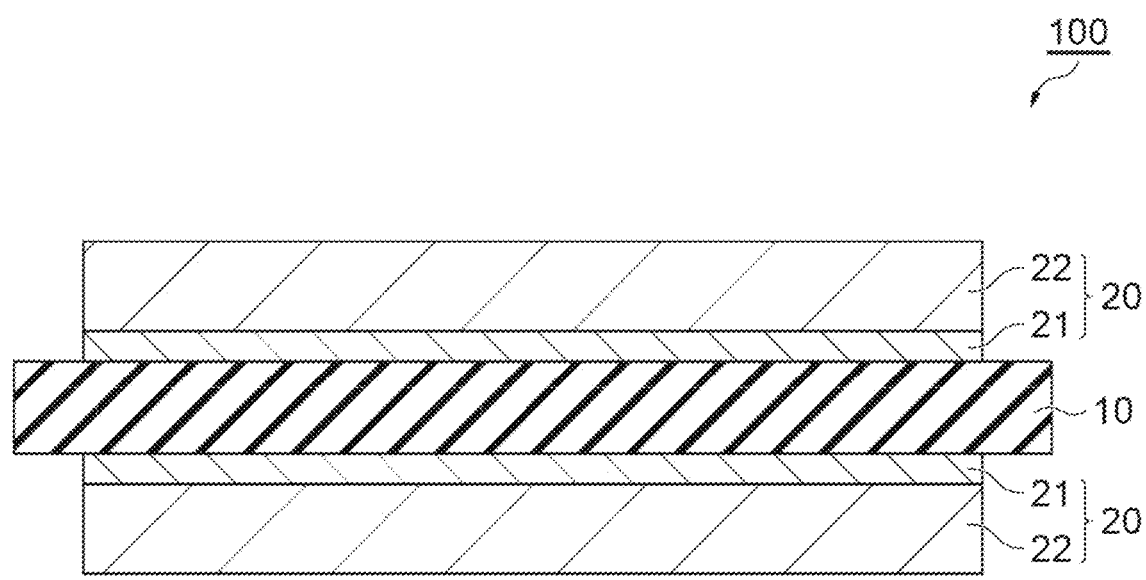
FIG. 1 is a cross-sectional view illustrating a composite substrate according to an embodiment.

Hereinafter, an embodiment of the present disclosure will be described with reference to the drawings in some cases. However, the following embodiments are examples for describing the present disclosure, and are not intended to limit the present disclosure to the following contents. In the description, the same elements or elements having the same functions are denoted by the same reference numerals, and redundant description will be omitted in some cases. The positional relationship such as up, down, left, and right is based on the positional relationship shown in the drawings unless otherwise specified. Further, the dimensional ratios of the elements are not limited to the ratios shown in the drawings.

FIG. 1 is a cross-sectional view taken along a stacking direction of a metal layer and a thermal sprayed layer of a composite substrate 100 according to an embodiment. The composite substrate 100 illustrated in FIG. 1 includes a ceramic plate 10 and a pair of laminated portions 20 sandwiching the ceramic plate 10. The laminated portion 20 includes, in this order from the ceramic plate 10 side, a metal layer 21 containing at least one selected from the group consisting of aluminum and an aluminum alloy, and a thermal sprayed layer 22 containing at least one selected from the group consisting of copper and a copper alloy. FIG. 1 illustrates a cross-section along the stacking direction of the metal layer 21 and the thermal sprayed layer 22.

One or both of the laminated portions 20 may be a conductor portion (a metal circuit) having a predetermined pattern. In this case, the composite substrate 100 is a circuit substrate. A semiconductor element is bonded to the conductor portion via, for example, a silver bonding layer to form a circuit.

The ceramic plate 10 may be made of an ordinary ceramic. Examples of the ceramics include aluminum nitride (AlN), silicon nitride ($Si_3N_4$), and aluminum oxide ($Al_2O_3$). The thickness of the ceramic plate 10 may be, for example, 0.2 to 1.0 mm from the viewpoint of improving durability against heat cycles and thinning while maintaining excellent insulation properties.

The metal layer 21 has a function of reducing thermal stress generated during heat cycles due to a difference in thermal expansion coefficient between the ceramic plate 10 and the thermal sprayed layer 22 while maintaining high thermal conductivity of the composite substrate 100. In order to sufficiently exhibit such a function, the metal layer 21 may contain at least one selected from the group consisting of aluminum and an aluminum alloy as a main component. Examples of the aluminum alloy include an aluminum-magnesium alloy and an aluminum-lithium alloy. Here, the "main component" is a component having a content of 90% by mass or more with respect to the entire metal layer 21. The thickness of the metal layer 21 may be, for example, 0.05 to 1 mm from the viewpoint of achieving thinning while sufficiently reducing thermal stresses generated during heat cycles.

The metal layer 21 may be formed by applying a brazing material on a main surface of the ceramic plate 10 and bonding a metal plate, or may be a thermal sprayed layer formed by thermally spraying metallic particles on the main surface of the ceramic plate 10 and performing a heat treatment. In the case of the thermal sprayed layer, the metal layer 21 may be formed on the main surface of the ceramic plate 10 without using the brazing material. If a mask is used at the time of thermal spraying, a conductor portion having a predetermined pattern can be formed without etching.

The thermal sprayed layer 22 may contain at least one selected from the group consisting of copper and a copper alloy as a main component from the viewpoint of sufficiently increasing the electrical conductivity while maintaining high thermal conductivity of the composite substrate 100. Examples of the copper alloy include a copper-phosphorus alloy and a copper-molybdenum alloy. Here, the "main component" is a component having a content of 90% by mass or more with respect to the entire thermal sprayed layer 22. The thickness of the thermal sprayed layer 22 may be, for example, 0.1 to 3 mm from the viewpoint of improving durability against heat cycles and thinning while sufficiently increasing electrical conductivity and thermal conductivity.

The thermal sprayed layer 22 is formed by thermally spraying metallic particles on the main surface of the ceramic plate 10 and heat-treating the thermal sprayed particles. The thermal sprayed layer 22 can be formed on the main surface of the metal layer 21 without using a brazing material. If a mask material is used at the time of thermal spraying, a conductor portion having a predetermined pattern can be formed without etching.

Figure 2:
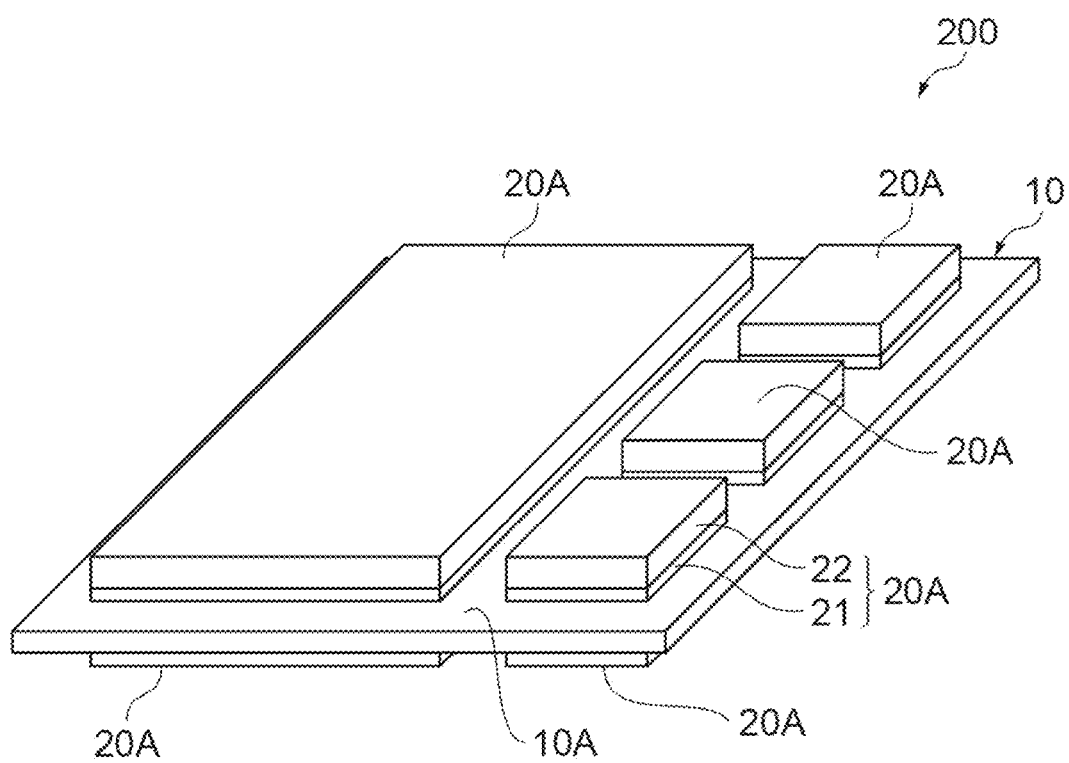
FIG. 2 is a perspective view illustrating a circuit substrate according to an embodiment.

FIG. 2 is a perspective view of the circuit substrate 200 according to one embodiment. The circuit substrate 200 includes the ceramic plate 10 and a plurality of conductor portions 20A provided on one main surface 10A of the ceramic plate 10. The shapes of the plurality of conductor portions 20A may all be the same, or may include different shapes as illustrated in FIG. 2. The conductor portion 20A includes the metal layer 21 and the thermal sprayed layer 22 in this order from the ceramic plate 10 side. That is, the conductor portion 20A has a laminated structure similar to the laminated portion 20 of FIG. 1. The circuit substrate 200 also includes a plurality of conductor portions 20A on the other main surface of the ceramic plate 10. In a modification, the circuit 200 may include one or more conductor portions 20A on only one main surface.

Figure 3:
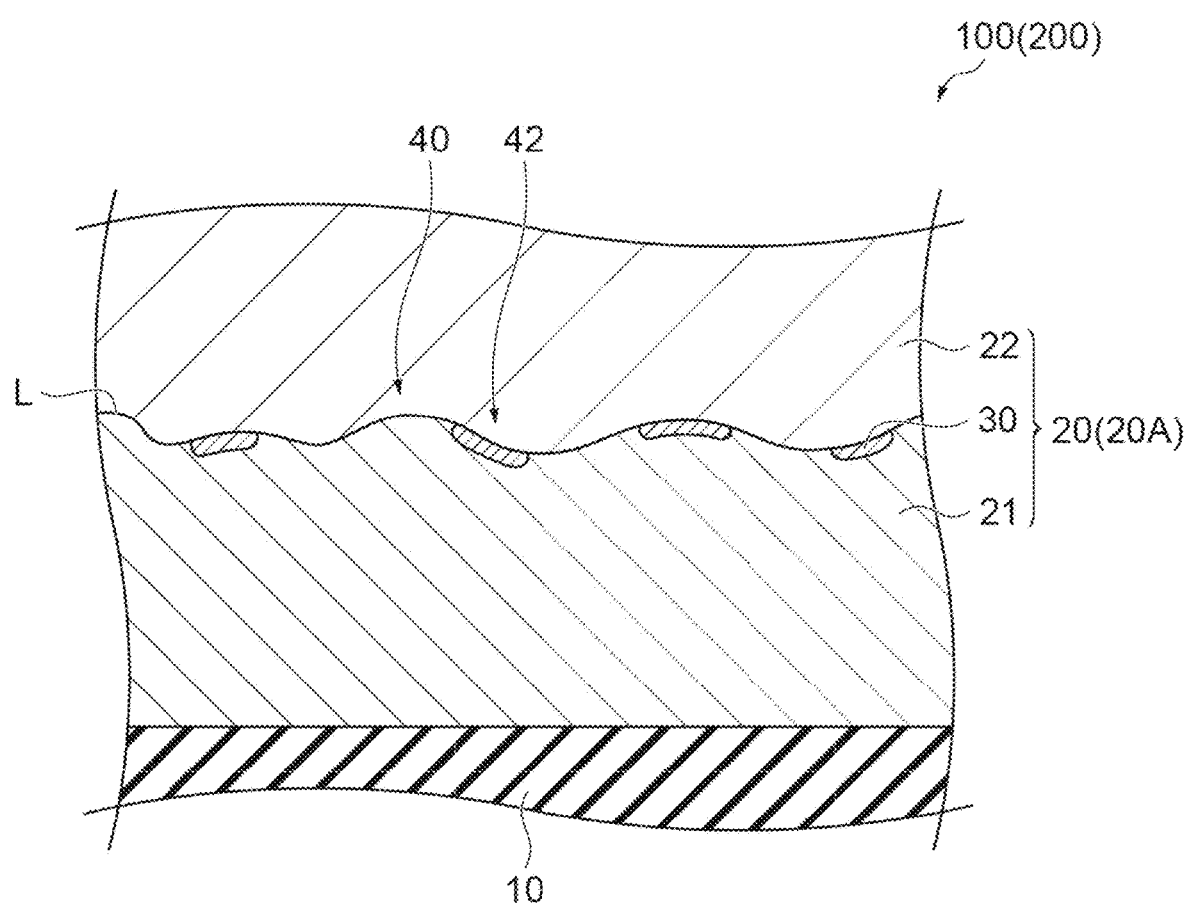
FIG. 3 is an enlarged cross-sectional view illustrating a portion of a cross-section of the composite substrate (the circuit substrate) according to an embodiment in an enlarged manner.

FIG. 3 is an enlarged cross-sectional view illustrating a part of a cross-section along the stacking direction of the metal layer 21 and the thermal sprayed layer 22 of the composite substrate 100 (the circuit substrate 200) in an enlarged manner. FIG. 3 illustrates a part of one metal layer 21 and the ceramic plate 10 and the thermal sprayed layer 22 adjacent to the metal layer 21 in the composite substrate 100 (the circuit substrate 200). An intermetallic compound 30 is scattered along a boundary line L between the thermal sprayed layer 22 and the metal layer 21. The intermetallic compound 30 contains copper and aluminum as constituent elements. For example, the intermetallic compound 30 contains at least one selected from the group consisting of $Cu_9Al_4$, CuAl, and $CuAl_2$. The intermetallic compound 30 can be identified by X-ray diffraction.

In the composite substrate 100 (the circuit substrate 200), the intermetallic compound 30 is scattered between the metal layer 21 and the thermal sprayed layer 22. A contact portion 40 where the metal layer 21 and the thermal sprayed layer 22 are in direct contact with each other and an intervening portion 42 where the intermetallic compound 30 is interposed between the metal layer 21 and the thermal sprayed layer 22 are formed between the metal layer 21 and the thermal sprayed layer 22.

Since the intermetallic compound 30 in the intervening portion 42 contains copper and aluminum as constituent elements, the intermetallic compound 30 is compatible with both the metal layer 21 and the thermal sprayed layer 22, and has a function of firmly bonding the metal layer 21 and the thermal sprayed layer 22. Accordingly, the electrical conductivity between the metal layer 21 and the thermal sprayed layer 22 can be improved. In addition, since the contact portion 40 bears the strain caused by thermal stress due to heat cycles, the concentration of the thermal stress on the intermetallic compound 30 in the intervening portion 42 can be reduced. In this way, cracking of the intermetallic compound, which is usually hard and brittle, can be reduced, and durability against heat cycles can be improved.

The length of the intermetallic compound 30 (the intervening portion 42) is less than 25 μm along the boundary line L on the metal layer 21 side of the thermal sprayed layer 22 when viewed in a cross-section as illustrated in FIG. 3. The length of the intermetallic compound 30 along the boundary line L can be measured by the following procedure. The composite substrate is cut using a diamond cutter, a band saw, or the like, and polished with diamond abrasive grains or the like to obtain a cross-section as illustrated in FIG. 3. The cross-section is observed with a scanning electron microscope (SEM), and a photograph of a magnified image of 3000 times is taken. The outer edge on the metal layer 21 side of the thermal sprayed layer 22 shown in the photograph is taken as the boundary line L, and the length of the intermetallic compound 30 along the boundary line L is measured. The length can be calculated by, for example, disposing a string along the boundary line L and calculating the length of the string at the intermetallic compound 30 portion and the magnification of the photograph. The measurement is performed by using photographs taken in five different regions which are randomly selected in the cross-section. In the present disclosure, an intermetallic compound whose length measured in this manner is 25 μm or more is considered to be layered.

In the present disclosure, "the intermetallic compound is scattered" means that the maximum value of the length of the intermetallic compound 30 along the boundary line L is less than 25 μm in the SEM photographs taken in the above-described five regions. In other words, in the SEM photographs taken in the above-described five regions, only intermetallic compounds 30 having the length along the boundary line L of less than 25 μm are included. In the SEM photographs taken in the above-described five regions, the length of the intermetallic compound 30 along the boundary line L may be 20 μm or less, and may be 15 μm or less, from the viewpoint of further improving durability against heat cycles. Accordingly, concentration of stress on the intermetallic compound 30 is further reduced, and durability against heat cycles can be sufficiently increased. The length of the intermetallic compound 30 along the boundary line L may be 2 μm or more, and may be 5 μm or more from the viewpoint of forming the thermal sprayed layer 22 in which work hardening is sufficiently alleviated.

When the cross-section is viewed, the coverage of the thermal sprayed layer 22 by the intermetallic compound based on the length of the boundary line L of the thermal sprayed layer 22 on the metal layer 21 side may be 75% or less, and may be less than 50%. Accordingly, a ratio of the contact portion 40 in which the thermal sprayed layer 22 and the metal layer 21 are in direct contact with each other on the boundary line L increases, and thus it is possible to further reduce concentration of thermal stress on the intermetallic compound 30 during heat cycles. Therefore, durability against heat cycles can be sufficiently improved. The coverage may be 10% or more, or may be 30% or more, from the viewpoint of sufficiently alleviating work hardening of the thermal sprayed layer 22 and from the viewpoint of more firmly bonding the metal layer 21 and the thermal sprayed layer 22.

Similar to the measurement of the length of the intermetallic compound 30, the coverage can be measured by using the photograph of the image enlarged by 3000 times and the string. That is, for example, the string is disposed along the boundary line L, and the length (L0) of the entire boundary line L and the length (L1) of the strings in the portion of the intermetallic compound 30 (the intervening portion 42) shown in the photograph are measured. When there are a plurality of intermetallic compounds 30, the length (L1) is the sum of the lengths along the boundary line L of the respective intermetallic compounds 30. The measurement is performed by using photographs taken in five regions randomly selected on the cross-section. A calculation of (L1/L0)×100 is performed using each photograph, and the mean value of the calculated values is taken as the coverage in the present disclosure.

An example of a method of manufacturing the composite substrate 100 includes:
a step of forming a first precursor film by spraying first metallic particles containing at least one selected from the group consisting of aluminum and an aluminum alloy onto the main surface of the ceramic plate 10 together with an inert gas;
a step of forming the metal layer 21 by heating the first precursor film in the inert gas atmosphere;
a step of forming a second precursor film by spraying second metallic particles containing at least one selected from the group consisting of copper and a copper alloy onto the surface of the metal layer 21 provided on the ceramic plate 10; and
a heating step of heating the second precursor film to obtain the thermal sprayed layer 22 and to generate the intermetallic compound 30 so as to be scattered between the metal layer 21 and the thermal sprayed layer 22.

In this example, both the metal layer 21 and the thermal sprayed layer 22 are formed by thermal spraying. A powder spray device can be used to form these layers. Specifically, the first metallic particles are thermal sprayed onto the main surface of the ceramic plate 10 using the powder spray device. Accordingly, the first precursor film is formed on the main surface of the ceramic plate 10. In this case, the first precursor film may be formed on one main surface and then the first precursor film may be formed on the other main surface. When the composite substrate having the laminated portion 20 on only one main surface of the ceramic plate 10 is manufactured, the first precursor film may be formed on only one main surface.

The first metallic particles may be aluminum particles or aluminum alloy particles containing other metal elements, such as aluminum-magnesium alloy particles and aluminum-lithium alloy particles. When aluminum alloy particles containing a metal element having a higher oxygen affinity than aluminum, such as magnesium and lithium, are used, the metal element such as magnesium or lithium reacts with an oxide on the surface of the ceramic plate during heating after film formation, and these tend to be strongly bonded. From the viewpoint of further improving the durability against heat cycles, the content of metal elements such as magnesium and lithium in the first metallic particle may be 6.0% by mass or less with respect to the entire first metallic particle.

The first precursor film formed on the ceramic plate is heated in the inert gas atmosphere to form the metal layer 21. The heating temperature at this time may be 400 to 600° C. By heating the first precursor film at a temperature of 400° C. or higher, the reaction between aluminum and the oxide on the surface of the ceramic plate 10 sufficiently proceeds. Accordingly, the metal layer 21 and the ceramic plate 10 can be strongly bonded to each other. By heating the first precursor film at a temperature of 600° C. or lower, it is possible to reduce the influence of softening of the first precursor film.

In this example, the metal layer 21 is formed by thermal spraying, but the forming process is not limited thereto. For example, the metal layer 21 may be provided on the ceramic plate 10 by preparing a metal plate containing at least one selected from the group consisting of aluminum and an aluminum alloy, and bonding the metal plate using a brazing material. In this case, it may be necessary to etch the metal layer 21 in order to form a conductor portion having a predetermined pattern on the ceramic plate 10.

In the case of thermal spraying, the metal layer 21 having a pattern (a circuit pattern) may be formed on the ceramic plate 10 by disposing a mask material covering part of the main surface of the ceramic plate 10. With this method, the conductor portion having high shape accuracy can be easily formed without performing an additional process such as etching after film formation.

After the metal layer 21 is formed, the thermal sprayed layer 22 is formed on the main surface of the metal layer 21 by thermal spraying. The thermal sprayed layer 22 is formed by, for example, the following procedure. The second metallic particles are thermal sprayed onto the main surface of the metal layer 21 opposite to the ceramic plate 10 to form the second precursor film. Examples of the second metallic particles include copper particles, copper-phosphorus alloy particles, and copper-molybdenum alloy particles. The content of the metal element other than copper in the second metallic particle may be 6.0% by mass or less with respect to the entire second metallic particle.

The thermal sprayed layer 22 is formed by heating the second precursor film formed on the main surface of the metal layer 21 in the inert gas atmosphere. The heating temperature of the second precursor film at this time may be 250 to 300° C., and may be 250 to 290° C. If the heat treatment temperature is too high, the intermetallic compound 30 is likely to be formed in a layered form, and the durability against heat cycles tends to decrease. On the other hand, if the heat treatment temperature is too low, work hardening in the thermal sprayed layer 22 cannot be sufficiently alleviated, and excellent electrical conductivity tends to be impaired. In addition, the amount of the intermetallic compound 30 produced tends to decrease.

The heating time of the second precursor film at the above heating temperature may be 5 minutes to 1 hour. When the heating time is too short, work hardening of the thermal sprayed layer 22 cannot be sufficiently alleviated, and excellent electrical conductivity tends to be impaired. In addition, the amount of the intermetallic compound 30 produced tends to decrease. On the other hand, if the heating time is too long, the intermetallic compound 30 is likely to be formed in a layered form, and the durability against heat cycles tends to decrease. By changing the heating temperature and heating time of the second precursor film, the coverage of the thermal sprayed layer 22 by the intermetallic compound 30 and the length of the intermetallic compound 30 along the boundary line L can be adjusted.

When the second precursor is deposited, the thermal sprayed layer 22 having the same pattern (the circuit pattern) as the metal layer 21 can be formed by using similar mask material as that used when the first precursor is deposited. With this method, the conductor portion having high shape accuracy can be easily formed without performing an additional process such as etching after film formation. In this manner, the circuit substrate having the conductor portion on the ceramic plate 10 may be manufactured. The thermal sprayed layer 22 may be formed so as to be slightly smaller than the metal layer 21.

Figure 4:
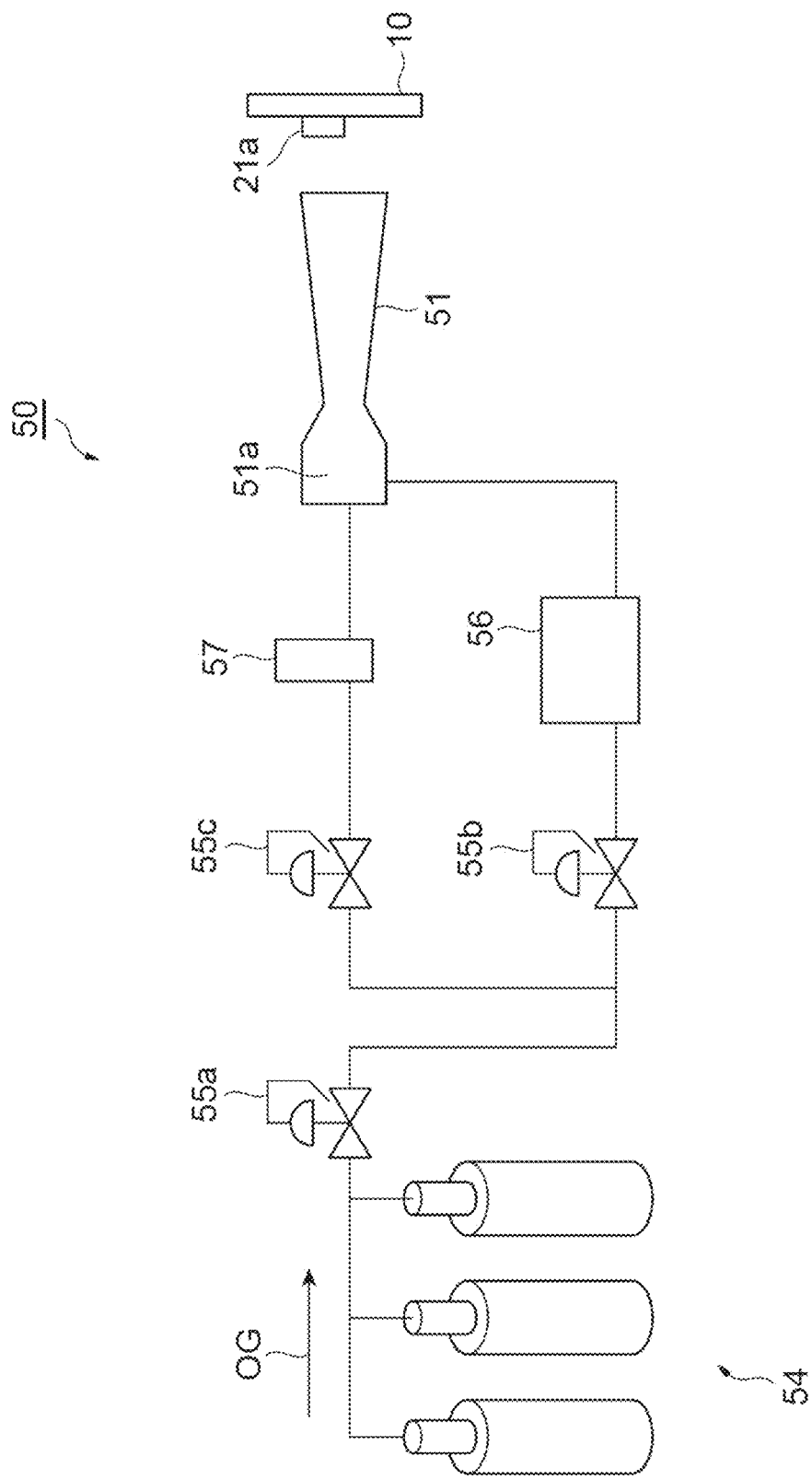
FIG. 4 is a diagram illustrating an example of a powder spray device used for forming a first precursor film and a second precursor film.

FIG. 4 is a diagram illustrating an example of a powder spray device used for forming the first precursor film and the second precursor film. A powder spray device 50 includes a gas supply unit 54, a heater 56, a particle supply unit 57, a nozzle 51 of a spray gun having a tapered divergent shape, and a pipe connecting the gas supply unit 54, the heater 56, the particle supply unit 57, and the nozzle 51. A first pressure regulation unit 55a is provided downstream of the gas supply unit 54. The pipe branches into two parts on the downstream side of the first pressure regulation unit 55a. The second pressure regulation unit 55b and the heater 56 are connected in this order to one of the two branched pipes, and the third pressure regulation unit 55c and the particle supply unit 57 are connected in this order to the other of the two branched pipes. The heater 56 and the particle supply unit 57 are connected to the nozzle 51 via pipes.

The gas supply unit 54 supplies an inert gas which functions as a working gas. The inert gas may be, for example, helium gas, nitrogen gas, or a mixed gas thereof. Apart of the working gas supplied from the gas supply unit 54 is pressure-regulated by the second pressure regulation unit 55b, and then heated by the heater 56 as necessary. The heating temperature may be, for example, 10 to 270° C. when forming the first precursor film. The heating temperature may be, for example, 10 to 650° C. when forming the second precursor film. Thereafter, the heated working gas is supplied to the nozzle 51 of the spray gun. The other part of the working gas supplied from the gas supply unit 54 is pressure-regulated by the third pressure regulation unit 55c and then supplied to the particle supply unit 57. Metallic particles for film formation are supplied from the particle supply unit 57 to the nozzle 51 of the spray gun together with working gas.

The gauge pressure of the working gas in the inlet 51a of the nozzle 51 may be 1.5 to 5.0 MPa. The heating temperature by the heater 56 is usually set lower than the melting point or softening point of the metallic particles to be deposited.

The first metallic particles or the second metallic particles and the working gas supplied to the nozzle 51 of the spray gun are compressed by passing through the tapered portion, and are accelerated by expanding at once in the divergent portion on the downstream side thereof. The metallic particles are heated to a predetermined temperature, accelerated to a predetermined speed, and then ejected from the outlet of the nozzle 51. The first metallic particles or the second metallic particles ejected from the nozzle 51 are sprayed to the main surface of the ceramic plate 10. As a result, the first metallic particles and the second metallic particles are deposited, while colliding in a solid phase state, on the main surface of the ceramic plate 10 and the surface of the metal layer 21, respectively, thereby forming the first precursor film and the second precursor film. In FIG. 4, a first precursor film 21a formed on the main surface of the ceramic plate 10 is illustrated.

By the above-described manufacturing method, it is possible to obtain the composite substrate 100 which has the ceramic plate 10 and the laminated portion 20 including the metal layer 21 and the thermal sprayed layer 22 in this order from the ceramic plate 10 side on both main surfaces of the ceramic plate 10, and in which the intermetallic compound 30 containing copper and aluminum as constituent elements is scattered between the metal layer 21 and the thermal sprayed layer 22. The description of the composite substrate 100 may also be applied to a method of manufacturing the composite substrate 100.

An example of a method of manufacturing a circuit substrate may include patterning the laminated portion 20 of the composite substrate 100 obtained by the above-described manufacturing method by etching to form a conductor portion. In another example, the conductor portion may be formed on both main surfaces of the ceramic plate 10 without performing etching by using a mask material when depositing the first precursor film and the second precursor film. In this case, in the manufacturing method of the circuit substrate, the first precursor film and the second precursor film each having a predetermined pattern shape may be formed using the mask material in each of the steps of forming the first precursor film and the second precursor film in the manufacturing method of the composite substrate described above. Otherwise, it can be produced in the same way as the composite substrate.

In the above-described method of manufacturing the composite substrate 100 and the circuit substrate 200, the second precursor film is heated so that the intermetallic compound 30 containing copper and aluminum as constituent elements is scattered. Accordingly, it is possible to obtain the thermal sprayed layer 22 in which work hardening is alleviated. The thermal sprayed layer 22 has excellent electrical conductivity. In addition, since the intermetallic compound 30 is not formed in a layered manner but is formed in a scattered manner, it is possible to reduce occurrence of cracks due to heat cycles and to improve durability against heat cycles. Therefore, the power module having the composite substrate 100 and the circuit substrate 200 is excellent in reliability. In addition, the intermetallic compound 30 being scattered between the metal layer 21 and thermal sprayed layer 22 may strengthen the bonding between the metal layer 21 and the thermal sprayed layer 22, thereby improving electrical conductivity.

Although some embodiments of the present disclosure have been described above, the present disclosure is not limited to the above-described embodiments. For example, it is not necessary to provide the laminated portions 20 (the conductor portions 20A) on both main surfaces of the ceramic plate 10, and for example, the laminated portion 20 (the conductor portion 20A) may be provided on only one main surface of the ceramic plate 10. In addition, at least one of thicknesses, shapes, and compositions of the metal layer 21 and the thermal sprayed layer 22 in the pair of laminated portions 20 (the conductor portion 20A) interposing the ceramic plate 10 therebetween may be different from each other.

EXAMPLES

Hereinafter, the content of the present disclosure will be described more specifically with reference to examples. However, the present disclosure is not limited to the following examples.

Example 1

(Manufacturing of Circuit Substrate)
As a ceramic plate, a substrate made of aluminum nitride (AlN) (size: length×width×thickness=60 mm×50 mm×0.635 mm, three point bending strength: 500 MPa, thermal conductivity: 150 W/mK, purity: 95% or more) was prepared.

A part of the main surface of the substrate was masked with an iron mask material. Aluminum particles (gas-atomized powder manufactured by Kojundo Chemical Laboratory Co., Ltd., median diameter: 24 μm) were sprayed onto the masked main surface by a powder spray device to form an aluminum film (a first precursor film). The aluminum film was formed under the following conditions: nitrogen gas was used as a working gas; the temperature of the working gas was 20° C.; and the pressure of the working gas at the nozzle inlet of the spray gun was 1.5 MPa.

The formed aluminum film was heat-treated at 500° C. for 3 hours in a nitrogen atmosphere to obtain a metal layer made of aluminum having a thickness of 0.2 mm.

Next, a part of the metal layer was masked with an iron mask material. Copper particles (water atomized powder manufactured by Fukuda Metal Foil & Powder Co., Ltd., median diameter: 17 μm) were sprayed onto the surface of the metal layer by a powder spray device to form a copper film (a second precursor film) on the surface of the metal layer. The copper film was formed under the following conditions: nitrogen gas was used as a working gas: the temperature of the working gas was set to 350° C., and the pressure of the working gas at the nozzle inlet of the spray gun was set to 3 MPa.

The copper film was heat-treated at 280° C. for 10 minutes in a nitrogen atmosphere to obtain a thermal sprayed layer made of copper having a thickness of 0.4 mm. The thermal sprayed layer was formed to have vertical and horizontal lengths smaller than those of the metal layer by about 50 μm.

The metal layer and the thermal sprayed layer were sequentially formed on both main surfaces of the ceramic plate in the above-described procedure, and the circuit substrate of Example 1 including the conductor portion having the metal layer and the thermal sprayed layer from the ceramic plate side on both main surfaces of the ceramic plate was obtained.

Figure 5:
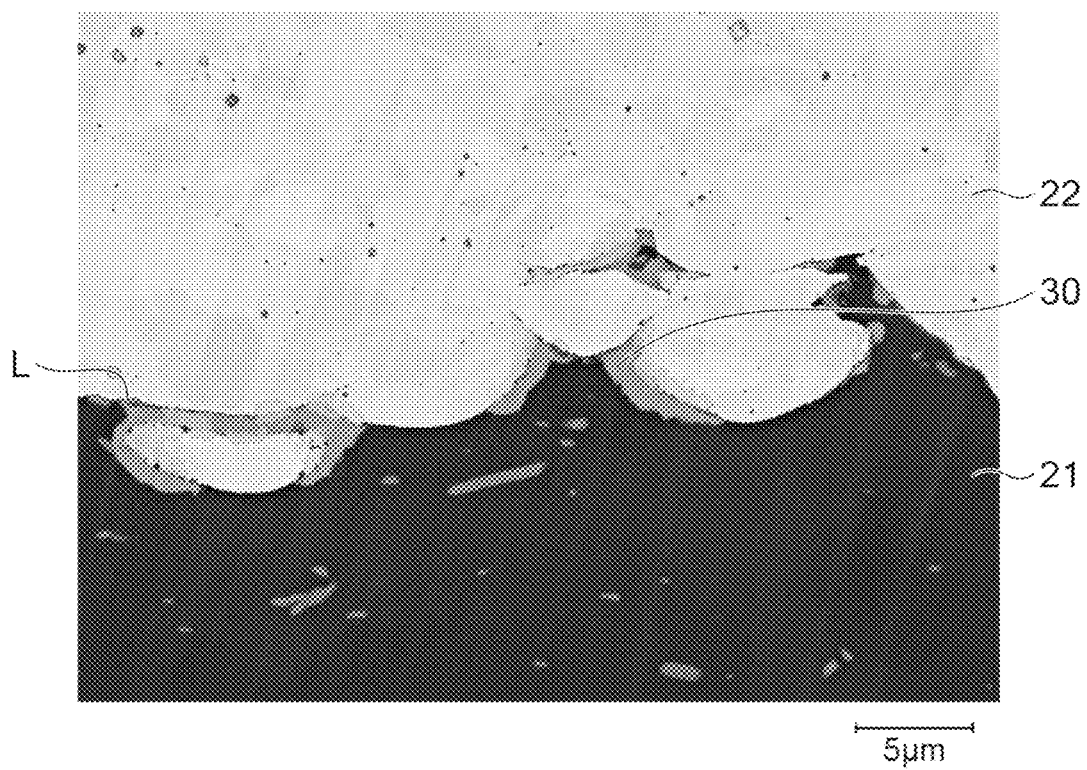
FIG. 5 is a scanning electron microscope photograph showing a cross-section of a circuit substrate of Example 1.

(Evaluation of Circuit Substrate)
<Evaluation by SEM Observation>
The circuit substrate was cut along the lamination direction of the metal layer and the thermal sprayed layer using a diamond cutter, and polished with diamond abrasive grains to obtain a cross-section for SEM observation. The cross-section was observed by SEM to confirm the form of the intermetallic compound between the metal layer and the thermal sprayed layer. The results are shown in Table 1. FIG. 5 is an SEM photograph showing a cross-section of the circuit substrate of Example 1.

SEM photographs (magnification: 3000 times) of FIG. 5 were taken at five different positions. In these SEM photographs, the maximum value of the length of the intermetallic compound along the boundary line L on the metal layer side of the thermal sprayed layer was obtained. In each of the SEM photographs, the length (L0) of the line L on the metal layer side of the thermal sprayed layer and sum of the lengths (L1) of the intermetallic compounds along the boundary line L were measured using a string. In each photograph, calculation of (L1/L0)×100 was performed, and the mean value of the calculated values was obtained as the coverage ratio. The results are shown in Table 1.

<Measurement of Electrical Conductivity>
The electrical conductivity of the conductor portion was measured by the eddy current method. The measurement was performed using a digital conductivity meter (manufactured by GE Sensing & Inspection Technologies Co., Ltd., trade name: AutoSigma3000). The results are shown in Table 1.

<Measurement of Vickers Hardness>
Vickers hardness on the surface of the thermal sprayed layer was measured. The measurement was performed using a dynamic ultra-micro hardness tester (manufactured by Shimadzu Corporation, trade name: DUH211). The results are shown in Table 1.

<Heat Cycle Test>
A heat cycle test of 1000 cycles was performed in which one cycle was "leaving in an environment of 180° C. for 30 minutes and then leaving in an environment of −45° C. for 30 minutes". After the heat cycle test, SEM observation was performed in the same manner as in the "Evaluation by SEM Observation" described above, and the presence or absence of peeling or the like of the metal layer and the thermal sprayed layer was inspected. As a result of the SEM observation, a case where peeling was not detected was evaluated as "A", and a case where peeling was detected was evaluated as "B". The results are shown in Table 1.

[Example 2], [Example 3], [Comparative Example 1] to [Comparative Example 3]

Circuit substrates were manufactured in the same manner as in Example 1 except that the heating temperature and the heating time of the copper film in a nitrogen atmosphere were changed as shown in Table 1, and each evaluation was performed. The results of each evaluation are shown in Table 1.

Comparative Example 4

A circuit substrate was manufactured in the same manner as in Example 1 except that the heat treatment of the copper film was not performed, and each evaluation was performed. The results of each evaluation are shown in Table 1.

Figure 6:
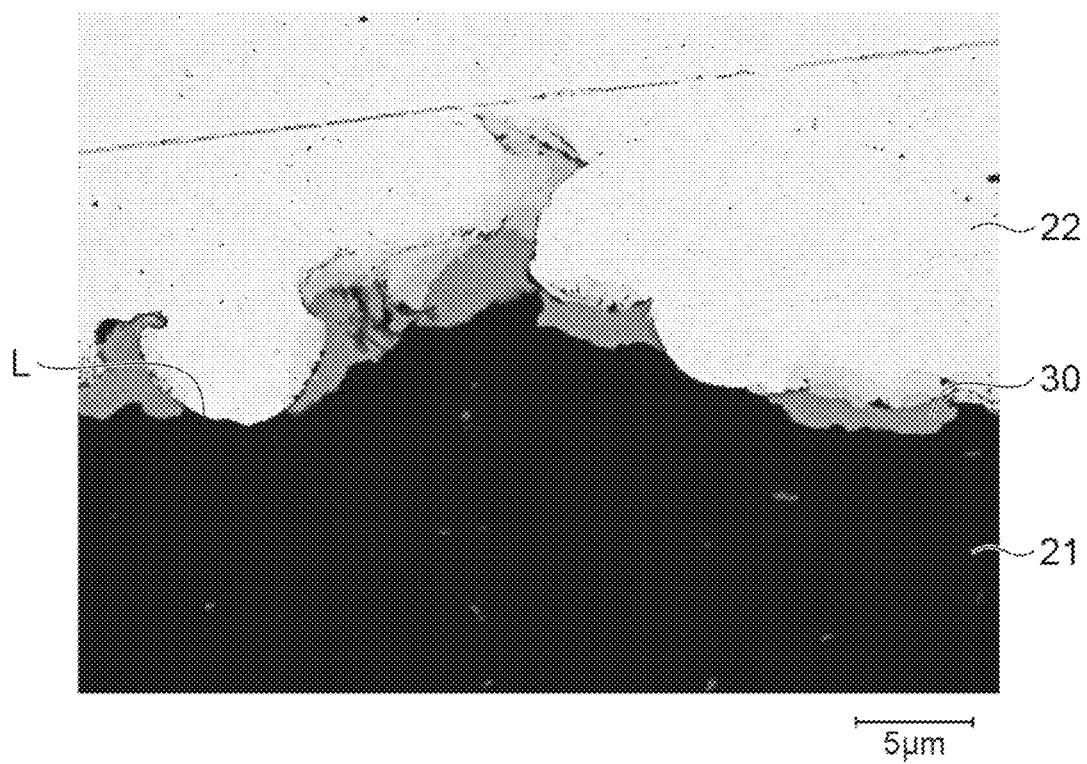
FIG. 6 is a scanning electron microscope photograph showing a cross-section of a circuit substrate of Example 3.
Figure 7:
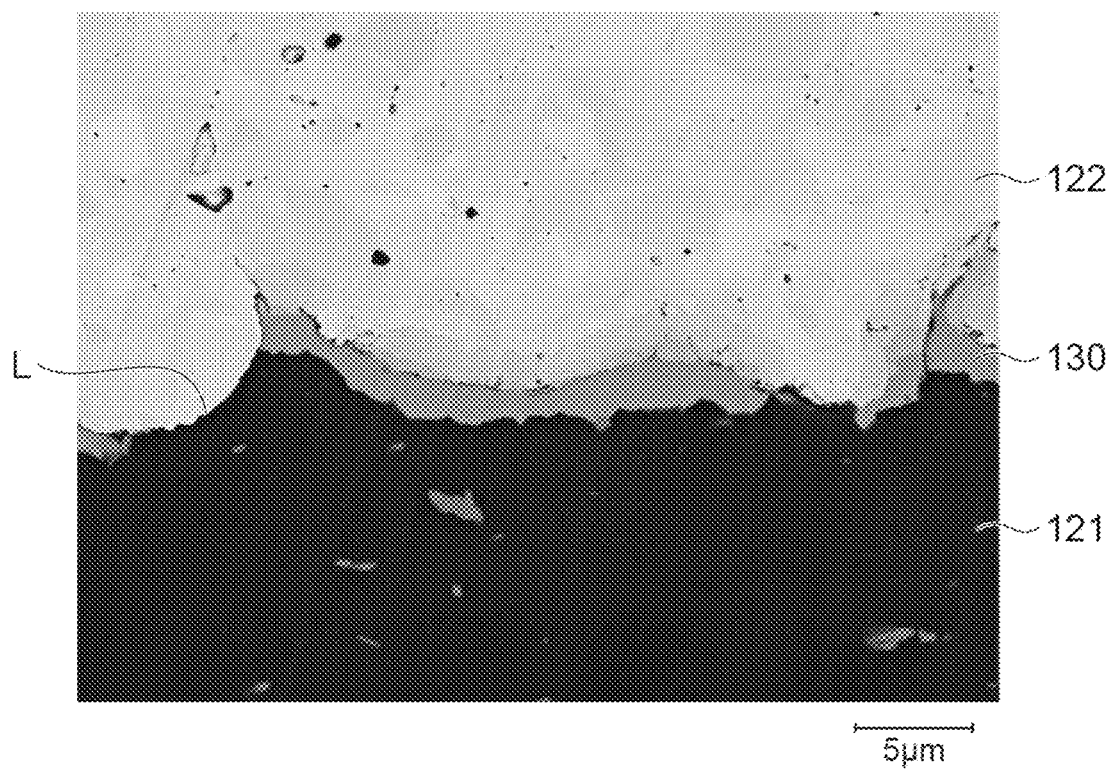
FIG. 7 is a scanning electron microscope photograph showing a cross-section of a circuit substrate of Comparative Example 1.
Figure 8:
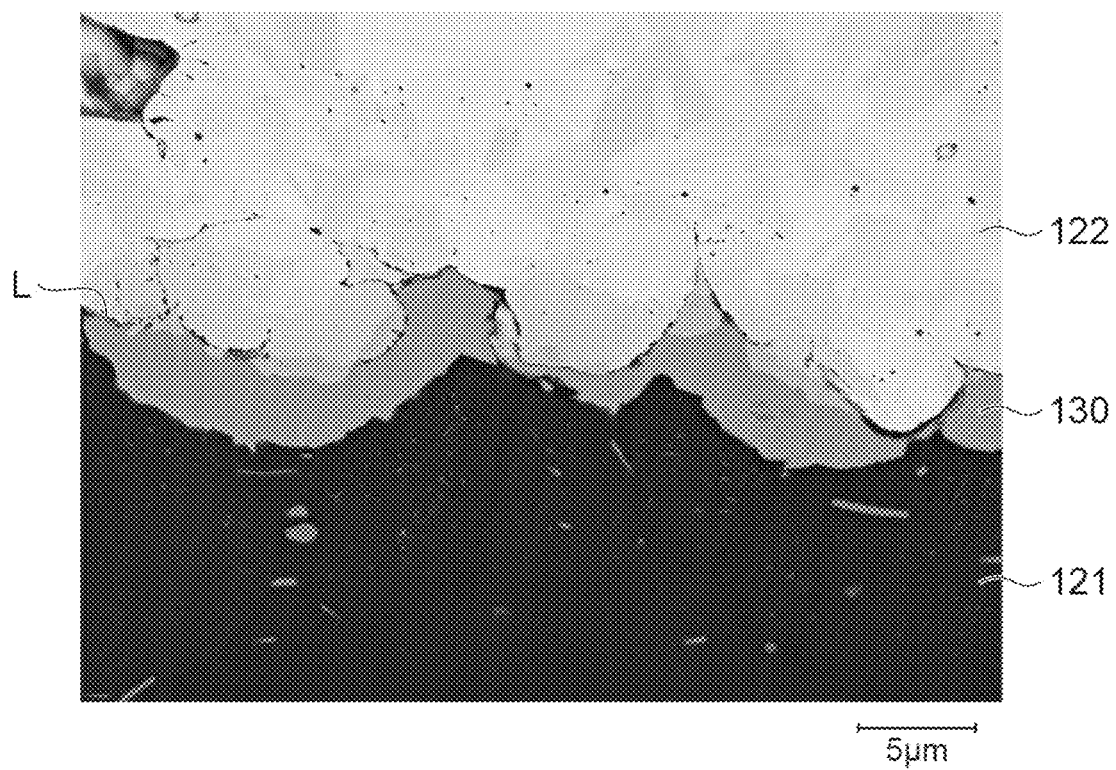
FIG. 8 is a scanning electron microscope photograph showing a cross-section of a circuit substrate of Comparative Example 2.
Figure 9:
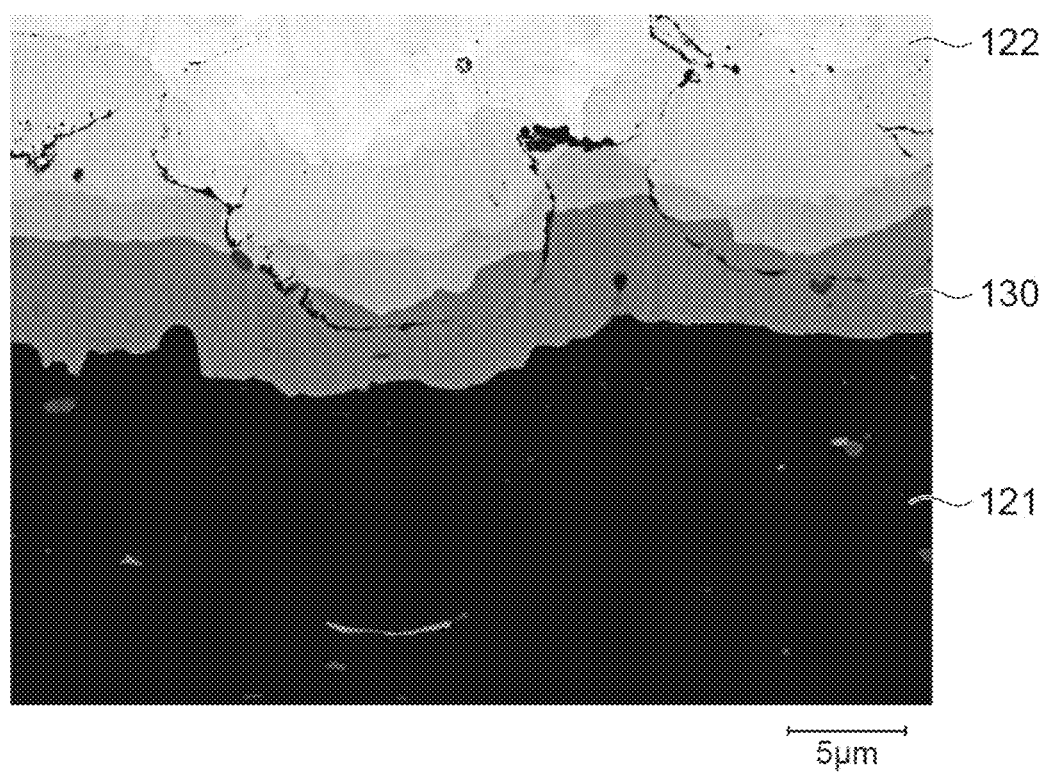
FIG. 9 is a scanning electron microscope photograph showing a cross-section of a circuit substrate of Comparative Example 3.
Figure 10:
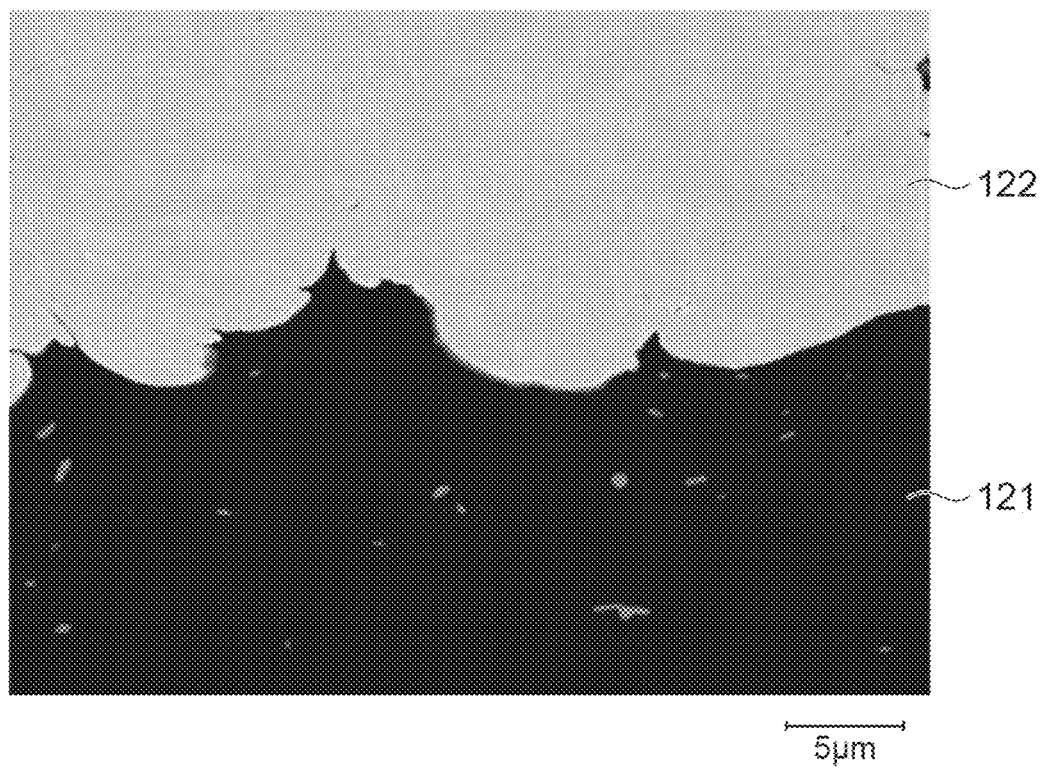
FIG. 10 is a scanning electron microscope photograph showing a cross-section of a circuit substrate of Comparative Example 4.

FIG. 6 is an SEM photograph showing a cross-section of the circuit substrate of Example 3. FIG. 7 is an SEM photograph showing a cross-section of the circuit substrate of Comparative Example 1. FIG. 8 is an SEM photograph showing a cross-section of the circuit substrate of Comparative Example 2. FIG. 9 is an SEM photograph showing a cross-section of the circuit substrate of Comparative Example 3. FIG. 10 is an SEM photograph showing a cross-section of the circuit substrate of Comparative Example 4. In the circuit substrate of each example, it was confirmed that the intermetallic compound 30 was scattered between the thermal sprayed layer 22 and the metal layer 21. On the other hand, in the circuit substrates of Comparative Examples 1 to 3, the intermetallic compound 130 was not scattered between the thermal sprayed layer 122 and the metal layer 121, but was layered.

TABLE 1

| | Heating Temperature [° C.] | Heating Time [minute] | Intermetallic Compound | | | Electrical Conductivity [% IACS] | Converted Vickers Hardness [HV$^x$] | Heat Cycle Test |
|---|---|---|---|---|---|---|---|---|
| | | | Form | Length [μm] | Coverage [%] | | | |
| Example 1 | 280 | 10 | Scattered | 10 | 48 | 92.1 | 99.9 | A |
| Example 2 | 280 | 60 | Scattered | 12 | 58 | 92.3 | 85.4 | A |
| Example 3 | 280 | 180 | Scattered | 13 | 72 | 92.2 | 87.2 | A |
| Comparative Example 1 | 330 | 10 | Layered | 25 | 80 | 92.7 | 80.1 | B |
| Comparative Example 2 | 380 | 10 | Layered | 31 | 98 | 93.4 | 74.8 | B |
| Comparative Example 3 | 430 | 10 | Layered | >50 | 100 | 94.4 | 70.2 | B |
| Comparative Example 4 | None | 0 | None | None | 0 | 62.0 | 187.1 | A |

The conductor portion of the circuit substrate of each example had excellent electrical conductivity. Further, from the results of the Vickers hardness, it was confirmed that the work hardening of the thermal sprayed layer was sufficiently alleviated in each Example. On the other hand, it was confirmed that Comparative Examples 1 to 3, in which the intermetallic compound was formed in a layered manner, were inferior to Examples 1 to 3 in terms of heat cycle durability. The circuit substrate of Comparative Example 4 in which the intermetallic compound was not scattered between the metal layer and the thermal sprayed layer had low electrical conductivity.

INDUSTRIAL APPLICABILITY

According to the present disclosure, it is possible to provide a composite substrate and a circuit substrate having excellent durability against heat cycles and high electrical conductivity.

REFERENCE SIGNS LIST

10: ceramic plate, 10A: main surface, 20: laminated portion, 20A: conductor portion, 21: metal layer, 21a: first precursor film, 22: thermal sprayed layer, 30: intermetallic compound, 40: contact portion, 42: intervening portion, 50: powder spray device, 51: nozzle, 51a: inlet, 54: gas supply unit, 55a: first pressure regulation unit, 55b: second pressure regulation unit, 55c: third pressure regulation unit, 56: heater, 57: particle supply unit, 100: composite substrate, 200: circuit substrate.

The invention claimed is:

1. A composite substrate comprising, in this order:
  a ceramic plate;
  a metal layer containing at least one selected from the group consisting of aluminum and an aluminum alloy; and
  a thermal sprayed layer containing at least one selected from the group consisting of copper and a copper alloy;
  wherein an intermetallic compound containing copper and aluminum as constituent elements is scattered between the metal layer and the thermal sprayed layer, and
  wherein a length of the intermetallic compound along a boundary line on the metal layer side of the thermal sprayed layer is 10 μm or less when viewed from a cross-section cut along a stacking direction of the metal layer and the thermal sprayed layer.

2. The composite substrate of claim 1, wherein the composite substrate includes, between the metal layer and the thermal sprayed layer, a contact portion in which the metal layer and the thermal sprayed layer are in direct contact with each other, and an intervening portion in which the intermetallic compound is interposed, when viewed from a cross-section cut along a stacking direction of the metal layer and the thermal sprayed layer.

3. The composite substrate according to claim 1, wherein the intermetallic compound contains at least one selected from the group consisting of $Cu_9Al_4$, $CuAl$, and $CuAl_2$.

4. The composite substrate according to claim 1, wherein the length of the intermetallic compound along a boundary line on the metal layer side of the thermal sprayed layer is 2 μm or more and 10 μm or less when viewed from the cross-section.

5. The composite substrate according to claim 1, wherein a coverage ratio of the thermal sprayed layer by the intermetallic compound is 75% or less with respect to a length of a boundary line on the metal layer side of the thermal sprayed layer when viewed from a cross-section cut along a stacking direction of the metal layer and the thermal sprayed layer.

6. A circuit substrate comprising a ceramic plate and a conductor portion on the ceramic plate,
  wherein the conductor portion includes a metal layer containing in this order from the ceramic plate side at least one selected from the group consisting of aluminum and an aluminum alloy and a thermal sprayed layer containing at least one selected from the group consisting of copper and a copper alloy, and wherein an intermetallic compound containing copper and aluminum as constituent elements is scattered between the metal layer and the thermal sprayed layer, and wherein a length of the intermetallic compound along a boundary line on the metal layer side of the thermal sprayed layer is 10 μm or less when viewed from a cross-section cut along a stacking direction of the metal layer and the thermal sprayed layer.

7. A method of manufacturing a composite substrate, the method comprising:

forming a precursor film by spraying metallic particles containing at least one selected from the group consisting of copper and a copper alloy on a surface of a metal layer provided on a ceramic plate and the metal layer containing at least one selected from the group consisting of aluminum and an aluminum alloy; and heating the precursor film to obtain a thermal sprayed layer and to generate an intermetallic compound containing copper and aluminum as constituent elements so as to be scattered between the metal layer and the thermal sprayed layer, and wherein a length of the intermetallic compound along a boundary line on the metal layer side of the thermal sprayed layer is 10 μm or less when viewed from a cross-section cut along a stacking direction of the metal layer and the thermal sprayed layer.

8. A method of manufacturing a circuit substrate, the method comprising:

forming a precursor film by spraying metallic particles containing at least one selected from the group consisting of copper and a copper alloy on a surface of a metal layer provided on a ceramic plate and the metal layer containing at least one selected from the group consisting of aluminum and an aluminum alloy; and heating the precursor film to obtain a thermal sprayed layer and to generate an intermetallic compound containing copper and aluminum as constituent elements so as to be scattered between the metal layer and the thermal sprayed layer, thereby forming a conductor portion having a predetermined pattern on the ceramic plate, and wherein a length of the intermetallic compound along a boundary line on the metal layer side of the thermal sprayed layer is 10 μm or less when viewed from a cross-section cut along a stacking direction of the metal layer and the thermal sprayed layer.

9. The composite substrate according to claim 2, wherein the intermetallic compound contains at least one selected from the group consisting of $Cu_9Al_4$, $CuAl$, and $CuAl_2$.

10. The composite substrate according to claim 2, wherein a coverage ratio of the thermal sprayed layer by the intermetallic compound is 75% or less with respect to a length of a boundary line on the metal layer side of the thermal sprayed layer when viewed from a cross-section cut along a stacking direction of the metal layer and the thermal sprayed layer.

11. The composite substrate according to claim 3, wherein a coverage ratio of the thermal sprayed layer by the intermetallic compound is 75% or less with respect to a length of a boundary line on the metal layer side of the thermal sprayed layer when viewed from a cross-section cut along a stacking direction of the metal layer and the thermal sprayed layer.

12. The composite substrate according to claim 4, wherein a coverage ratio of the thermal sprayed layer by the intermetallic compound is 75% or less with respect to a length of a boundary line on the metal layer side of the thermal sprayed layer when viewed from a cross-section cut along a stacking direction of the metal layer and the thermal sprayed layer.

* * * * *